United States Patent
Han et al.

(10) Patent No.: US 6,870,434 B2
(45) Date of Patent: Mar. 22, 2005

(54) METHOD FOR COMPENSATING TEMPERATURE IN CRYSTAL OSCILLATOR

(75) Inventors: Jin Ho Han, Chungcheongnam-Do (KR); Myung Shin Kwark, Daejon-Shi (KR); Jong Dae Kim, Daejon-Shi (KR)

(73) Assignee: Electronics and Telecommunications Research Institute, Daejeon-Shi (KR)

( * ) Notice: Subject to any disclaimer, the term of this patent is extended or adjusted under 35 U.S.C. 154(b) by 0 days.

(21) Appl. No.: 10/464,735

(22) Filed: Jun. 19, 2003

(65) Prior Publication Data

US 2004/0124937 A1 Jul. 1, 2004

(30) Foreign Application Priority Data

Dec. 24, 2002 (KR) ................................ 10-2002-0083748

(51) Int. Cl.[7] ................................................ H03L 1/02
(52) U.S. Cl. .................. 331/158; 331/116 R; 331/36 C
(58) Field of Search ............................ 331/158, 116 R, 331/116 FE, 66, 73, 70, 36 C, 179

(56) References Cited

U.S. PATENT DOCUMENTS

| 5,777,524 | A | * | 7/1998 | Wojewoda et al. | ..... 331/116 R |
| 5,994,970 | A | * | 11/1999 | Cole et al. | ..................... 331/68 |
| 2002/0180544 | A1 | * | 12/2002 | Fukayama et al. | .......... 331/176 |

FOREIGN PATENT DOCUMENTS

| JP | 07-221547 | 8/1995 | ............ H03B/5/32 |
| KR | 2001-09709 | 2/2001 | ............ H03B/5/32 |
| KR | 010009126 | 5/2001 | ............ H03B/5/32 |

OTHER PUBLICATIONS

Ralf Achenbach, et al.; "A Digitally Temperature–Compensated Crystal Oscillator"; IEEE Journal of Solid–State Circuits; vol. 5, No. 4; Dec. 1997; pp. 1502–1506.
Oiuting Huang, et al.; "Design Considerations for High–Frequency Crystal Oscillators Digitally Trimmable to Sub–ppm Accuracy"; IEEE Transaction on Very Large Scale Integration (VLSI) Systems; vol. 5, No. 4; Dec. 1997; pp. 408–416.

* cited by examiner

Primary Examiner—Robert Pascal
Assistant Examiner—Joseph Chang
(74) Attorney, Agent, or Firm—Piper Rudnick LLP (57) ABSTRACT

The present invention relates to a method for compensating temperature in a crystal oscillator including a capacitor array consisted of a first bank of unit capacitors each with low capacitance and a second bank of unit capacitors each with high capacitance. The method comprising the steps of calculating memory address that stores information about the capacitor array address in accordance with the temperature that is subtracted from present temperature by a temperature offset code; reading data from a memory address corresponding to remain bits excepted lowest bit when the lowest bit is 0 among the memory address; averaging data read from a memory address corresponding to remain bits excepted lowest bit and data of a memory address incremented by 1 from the memory address when the lowest bit is 1 among the memory address; transmitting data read from the memory address or averaged data to the first bank or second bank by comparing the memory address and temperature boundary code; and adjusting the capacitor array with capacitance corresponding to a present temperature by using data transmitted to the first bank or second bank.

5 Claims, 7 Drawing Sheets

METHOD FOR COMPENSATING TEMPERATURE IN CRYSTAL OSCILLATOR

BACKGROUND OF THE INVENTION

1. Field of the Invention

The present invention relates to a crystal oscillator providing a reference frequency to communication system, and more specifically, to a method for compensating temperature in the crystal oscillator.

2. Description of the Prior Art

In recent years, techniques for wireless communication equipments have been actively developed. The wireless communication equipment has a crystal oscillator to provide a reference frequency. The crystal oscillator for compensating temperature among those oscillators provides a constant reference frequency in regardless of variations of surrounding temperature. More researches have been conducted for the temperature compensator of the crystal oscillator in digital form for implementing high frequency accuracy and one chip, because analogue form has a disadvantage for a small-sized device.

Hereinafter, design of the crystal oscillator by prior art will be explained with reference to FIG. 1.

Figure 1:
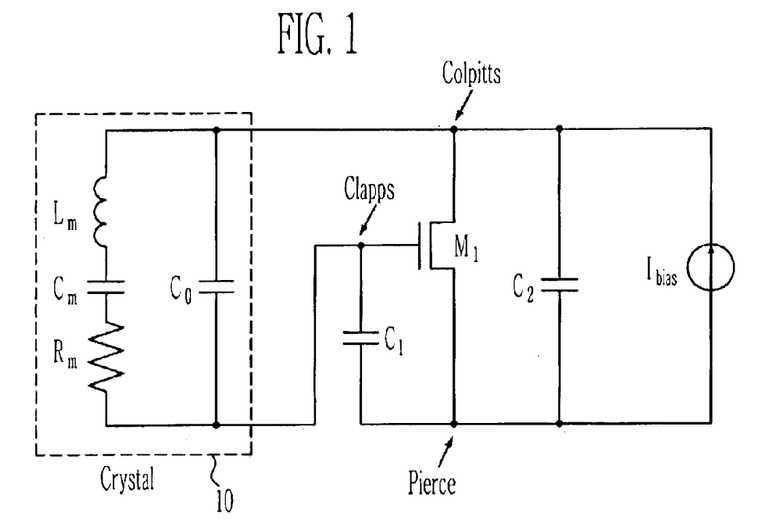
FIG. 1 shows a circuit for explaining a three-point crystal oscillator of the prior art.

FIG. 1 shows a circuit for explaining a three-point crystal oscillator of the prior art. Referring to FIG. 1, the characteristics of the three-point crystal oscillator are determined by the three points of Colpitts, Pierce, and Clapp. Capacitors $C_1$ and $C_2$ change transconductance of the transistor M1 to frequency-dependent negative resistance. At this time, the negative resistance (−R) can be defined as equation 1 below.

$$-R = \frac{g_m}{\omega_0^2 C_1 C_2} \qquad [\text{Equation 1}]$$

Crystal static capacitance $C_0$ of the crystal oscillator is parallel connected from $C_1$, $C_2$, and −R. Therefore, the negative resistance shown in the portion of Lm, Cm, and Rm of the crystal 10 is smaller than that obtained by the equation 1. $C_1$ and $C_2$ are designed much bigger than $C_0$ in actual design. The equation 1 can also be applied to expect minimum transconductance $g_{mc}$ to compensate loss due to Rm and to maintain oscillation.

The minimum transconductance $g_{mc}$ can be defined as equation 2 below.

$$g_{mc} = R_m \omega_0^2 C_1 C_2 \qquad [\text{Equation 2}]$$

Rm is a motional resistance of a resonator. $C_1$ and $C_2$ must be the same for optimal tradeoff between required transconductance and frequency safety. This means that the required transconductance is proportional to a square of load capacitance and oscillation frequency to have resonance.

For the exact measurement of power consumption, it is very important to find not only minimum transconductance for starting oscillation but also oscillation amplitude in steady state. The oscillation amplitude needs to be exceeded above specific level at a local oscillator of a RF receiver. For example, 0 dBm is required to turn on/off a switch transistor of a mixer while minimizes noise. The oscillation amplitude must be big enough to drive a digital prescaler in a frequency mixer. The amplifier should have gain much higher than the oscillation frequency so that the amplification at behind stage of the oscillator is not efficient for normal power.

If the oscillation amplitude in steady state is taken into consideration, power consumption requirement can be formulated in different way other than determined only by start-up condition. The exact expression of steady state amplitude of the three-point oscillator implemented as a MOS transistor can be obtained by time domain analysis. $M_1$ should be designed to have transconductance much higher than $(\sqrt{3}/\sqrt{2})g_{mc}$ in actual design. In this case, voltage swing across the gate of $M_1$ is so big that it becomes turned off during each period of the oscillation. If duty cycle of current of $M_1$ is α, equation 3 below can be applied to derive Vm that is oscillation amplitude in stead state.

$$x = \cos(\alpha \pi) = \frac{V_T - V_B}{V_m} \qquad [\text{Equation 3}]$$

Referring to equation 3, $V_B$ means a DC biased voltage in steady state between the gate and source of the $M_1$. And, $V_T$ is a threshold voltage of $M_1$. According to the define of x as shown in equation 3, Vm that is oscillation amplitude in steady state can be derived as in equations 4 and 5.

$$V_m = \frac{4 I_o}{g_{mc}} \frac{(2+x^2)\sqrt{1-x^2} - 3x\cos^{-1}(x)}{(1+2x^2)\cos^{-1}(x) - 3x\sqrt{1-x^2}} =$$

$$\frac{I_o}{g_{mc}} f(x) \approx \frac{I_o(5+x)}{3R_s \omega_0^2 C_1 C_2} \qquad [\text{Equation 4}]$$

$$\frac{2\beta I_o}{g_{mc}^2} = \left(\frac{g_{m1}}{g_{mc}}\right)^2 =$$

$$g^2(x) = \frac{9\pi}{2} \frac{(1+2x^2)\cos^{-1}(x) - 3x\sqrt{1-x^2}}{\left(2+x^2\sqrt{1-x^2} - 3x\cos^{-1}(x)\right)^2} \qquad [\text{Equation 5}]$$

In equation 5, x is a monotonic function of ratio between $g_{m1}$ and $g_{mc}$. When the ratio of $g_{m1}$ and $g_{mc}$ changes from 1.225 to 10, x is rapidly rose from −1 to 0.7. In accordance with the equation 4, this results in 28% change of oscillation amplitude. When the ratio of $g_{m1}$ and $g_{mc}$ is more than 10, the oscillation amplitude is not changed. When the transconductance of M1 is several times bigger than the threshold for oscillation, the transconductance contributes less to determine the amplitude of the oscillator in steady state. In this case, dominant parameters are a bias current proportional to Vm and a $g_{mc}$ inverse proportional to Vm.

Most oscillators are designed to have specific amplitude for oscillation. This means the amplitude can be adjusted to have high transconductance. Therefore, the duty cycle of the current in $M_1$ is lower than 100%, and the equation 4 defines the value of Vm. A bias current is adjusted to a square of oscillation frequency to have same Vm in accordance with the equation 4.

The motional resistance of the high frequency crystal can be lower than that of the low frequency crystal. However, such reduction in Rs will be limited by on-resistance of switch of trimming network. Furthermore, the accuracy of the capacitor array limits the ability for scaling capacitors $C_1$ and $C_2$ in order to consume less power.

Hereinafter, the frequency compensation for the crystal oscillator in digital type will be described.

One of the requirements for the present oscillator design is the accuracy of oscillation frequency in a range of sub-ppm. The accuracy in a state of the crystal resonator not compensated is about ±50 ppm including difference due to a change from temperature and cutting angle. One method for compensating the oscillation frequency is to change the equivalent capacitance parallel- connected to the resonator. In the three-point oscillator, the equivalent capacitance is a shunt capacitance $C_0$ that is parallel connected to $C_1$ and $C_2$.

The capacitors $C_1$ and $C_2$ should be made a few times higher than the capacitor $C_0$ for frequency stability. This means that a mount of change should be large to cover a wider compensation area. The oscillation frequency of such a circuit is given approximately by the equation 6 below.

$$f_{o+c} = \frac{1}{2\pi\sqrt{L_m \frac{C_m C_L}{C_m + C_L}}} \approx \frac{1}{2\pi\sqrt{L_m C_m}}\left(1 + \frac{C_m}{2C_L}\right) \quad [\text{Equation 6}]$$

In the equation 6, Lm and Cm are each motional inductance and motional capacitance of a resonator. Meanwhile, $C_L$ is an equivalent load capacitance dominated by the $C_1$ and $C_2$. Fractional frequency variation due to the $C_L$ is the second term of parenthesis in the equation 6. This can be used as a method for compensating the crystal oscillator.

Figure 2:
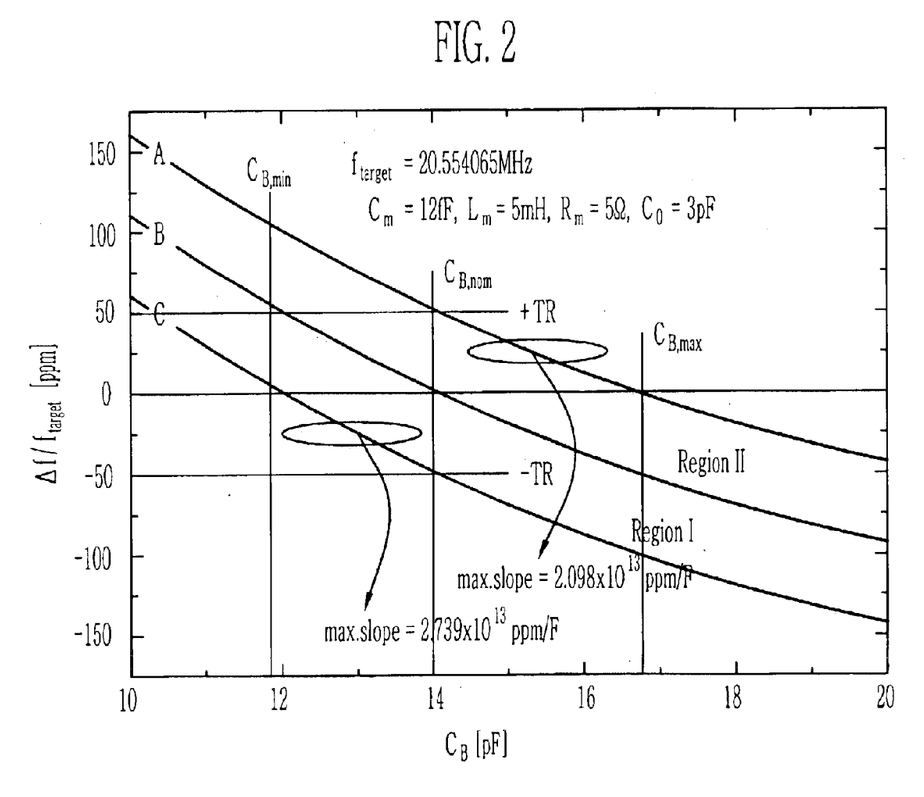
FIG. 2 shows a graph representing frequency variation of the compensating capacitance $C_B$ function of the crystal oscillator.

FIG. 2 shows not only crystal nominal characteristic but also characteristic limiting frequency deviation. The extremes are represented to +TR and −TR. In FIG. 2, x axis represents $C_B$ not $C_L$. $C_B$ means a serial combination of $C_1$ and $C_2$ implemented as two banks. That is, when $C_1=C_2$, $C_B=0.5C_1=0.5C_2$. $C_L$ is a parallel combination of $C_0$ and $C_B$. For example, frequency can be adjusted along the curve A in FIG. 2. In this case, highest value of unit capacitance in a capacitor array can be determined to achieve the compensating resolution of 0.2~0.3 ppm in compensation area. In other example, the oscillation frequency can be compensated along the curve C. Since the curve C has the highest inclination among compensating curves, the smallest unit capacitance in capacitor array can be determined. When the smallest unit capacitance in capacitor array is used, more unit capacitors are needed to compensate along the curve A. Also, to have compensating area of 100 ppm in consideration of 20% error of MOS capacitor, $2^{10}$ of unit capacitor is needed. When the capacitor array needs to be consisted of $C_1$ and $C_2$ for a fixed capacitance (that is required to remove negative resistance produced by the $M_1$ even when a switch is turned off) and frequency compensation, the many unit capacitors become an obstacle for low power consumption.

Figure 3A:
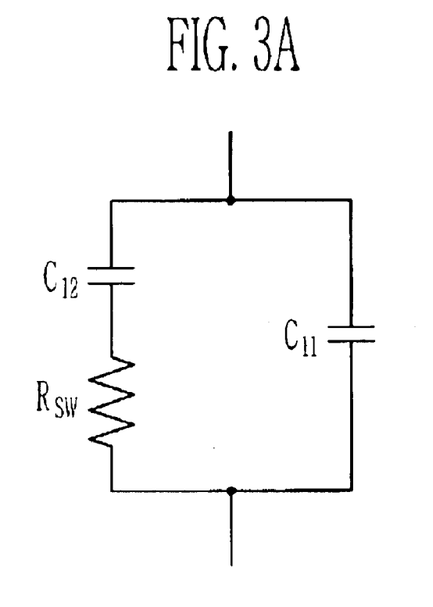
FIGS. 3a and 3b shows equivalent circuits of a capacitor array.
Figure 3B:
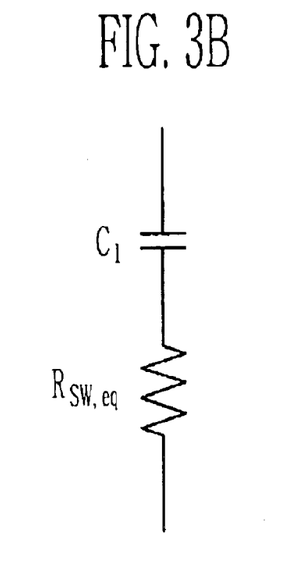

In accordance with the equation 4, current consumption is proportional to the equivalent resistance that is serially connected to $C_1$ and $C_2$. Therefore, the on-resistance of the MOS switch forming the capacitor array must be taken into consideration to minimize power. When $C_1$ serially connected to the equivalent resistance Rsw of all switches that are turned on as in FIG. 3a is regarded to consist of $C_{11}$ that is fixed and $C_{12}$ that can be varied, FIG. 3a can be changed to FIG. 3b, so that the relation between required current and $C_{12}$ can be obtained. The equivalent resistance Rsw,eq in FIG. 3b is approximately related to the switch resistance. The equivalent resistance Rsw,eq can be shown in equation 7 below.

$$R_{SW,eq} \approx \left(\frac{C_{12}}{C_{11}+C_{12}}\right)^2 R_{SW} = \left(\frac{C_{12}}{C_1}\right)^2 R_{SW} \quad [\text{Equation 7}]$$

The on-resistance of a minimum-sized switch in a typical 0.6 μm CMOS technology is of the other of several kilo-ohms. To reduce the on-resistance, the width of the switch transistor should be sufficiently wide. However, the drain -and substrate capacitance, which affects the compensation accuracy when the switch turns off, becomes so large that the width of the gate cannot be made too wide. Not only the size of the switch but also $C_1$ and $C_2$ must be traded off between accuracy and power consumption.

Figure 4A:
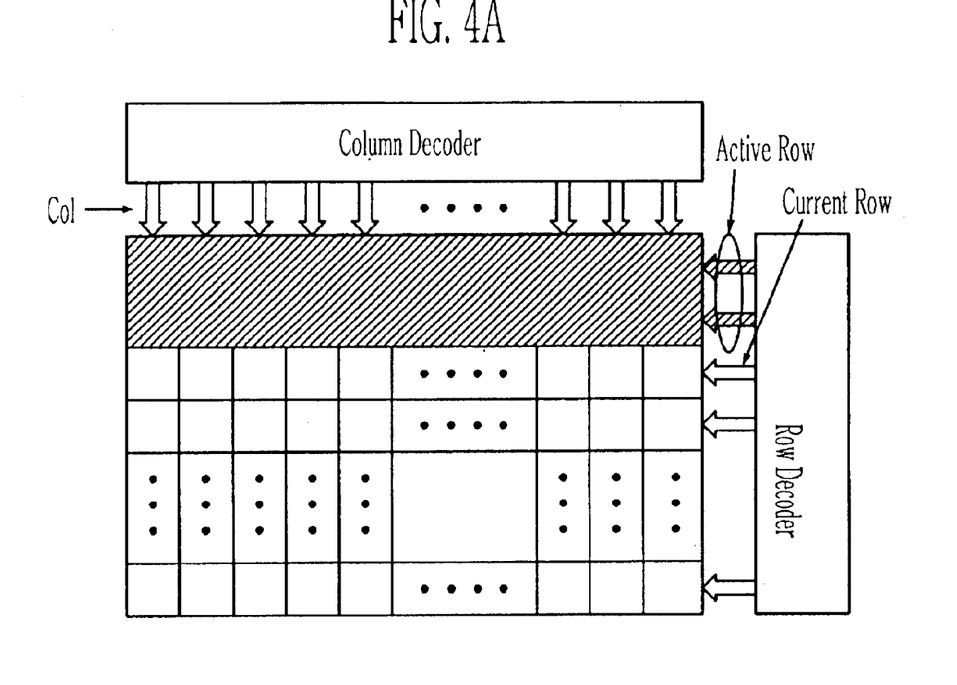
FIGS. 4a and 4b shows a bank of compensating capacitor using thermometer code.
Figure 4B:
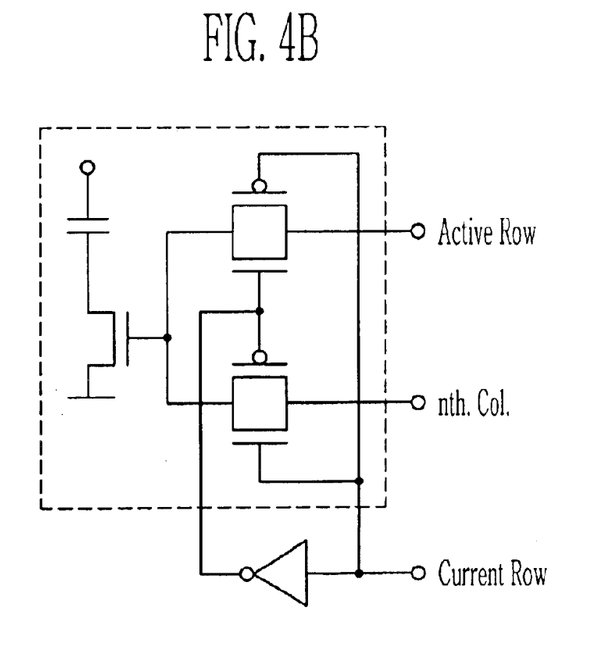

How to organize compensating capacitor array also should be taken into consideration. The most immediate way is to organize binary weighted array connected by switches having binary weighted channel widths. However, monotonicity of the compensation curve is critical concern for terminal system design, so that the value of LSB (Least Significant Bit) capacitor becomes low to ensure sufficient matching accuracy. Alternatively, the capacitor array can be organized as a parallel arrangement of unit capacitors, and controlled by thermometer codes as shown in FIG. 4a. Increase in total compensating capacitance is achieved by adding a new unit capacitor, so that the monotonicity can be guaranteed in this case. However, a parallel array of unit capacitors requires not only many more switches but also additional decoding logic to realize the thermometer code. This does not lose monotonicity while reducing amount of the total compensating capacitance, but increase the overall silicon area. In application requiring only frequency stability, large $C_1$ and $C_2$ are not required, and inherent resonance frequency of the crystal is not required. Therefore, the size of $C_1$ and $C_2$ can be made several times higher than that of $C_0$ to transform sufficient negative resistance generated by $M_1$ into the series resonator loop of the crystal. Lower capacitance brings in low current consumption. Therefore, the parallel arrangement of the unit capacitor can achieve low power while keeping monotonicity. At the time of designing thermometer code, many unit capacitors within the capacitor array should be selected at the same time, which is different from the case of RAM device. Referring to FIG. 4b, to implement simultaneous selection without any wires, decoding logic by a row decoder and a column decoder must be separated from the four transistors in each switch site. A pass transistor logic of SW=(AR∩$\overline{CR}$)∪(COL∩CR) is implemented by the four transistors. AR (Active Row) represents rows in which all unit capacitors are turned on, so that all unit capacitors in the row having AR as 1 becomes turned on even when a column is 0. CR (Current Row) represents the current row being selected, and acts as a moving cursor showing that some unit capacitance of the row are added to $C_1$ and $C_2$. The column decoder makes column as 1 and thereby shows the position up to which the row should be turned on. This enables it possible to distribute decoding logic and to reduce an amount of wiring. The parallel arrangement using the binary weighted arrangement and thermometer code had problems of monotonicity and large silicon area consumption, etc.

SUMMARY OF THE INVENTION

Therefore, the object of the present invention is to provide a method for compensating temperature in the crystal oscillator, with low power used, and temperature compensator of the conventional crystal oscillator in digital type being made in one-chip.

To achieve the above object, preferably, the method for compensating temperature in the crystal oscillator in accordance with the present invention comprises the steps of calculating memory address that stores information about the capacitor array address in accordance with the temperature that is subtracted from present temperature by a temperature offset code; reading data from a memory address corresponding to remain bits excepted lowest bit when the lowest bit is 0 among the memory address; averaging data read from a memory address corresponding to remain bits excepted lowest bit and data of a memory address incremented by 1 from the memory address when the lowest bit is 1 among the memory address; transmitting data read from the memory address or averaged data to the first bank or second bank by comparing the memory address and temperature boundary code; and adjusting the capacitor array with capacitance corresponding to a present temperature by using data transmitted to the first bank or second bank.

Figure 7:
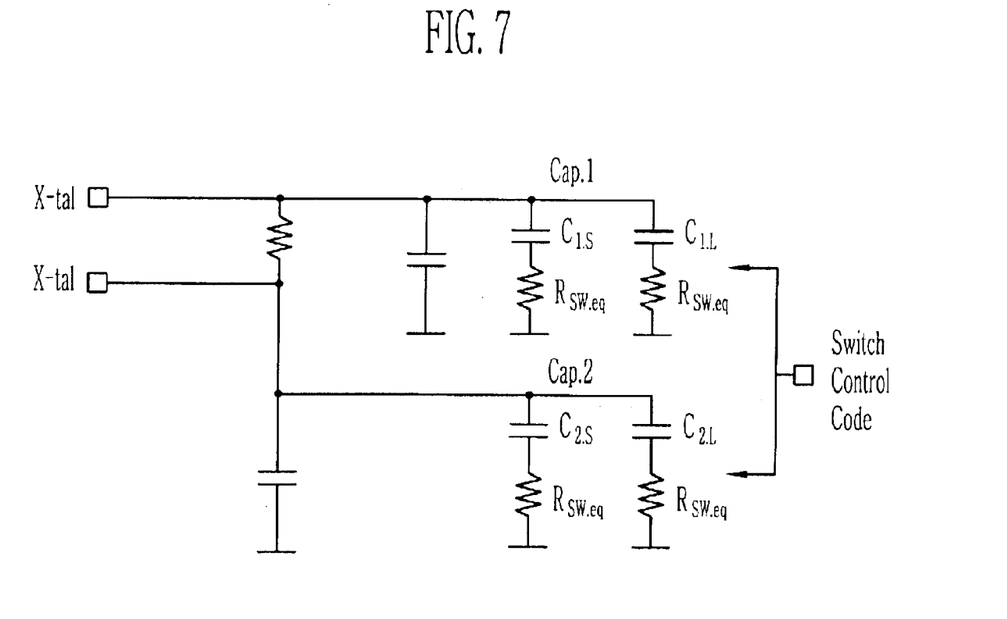
FIG. 7 shows a equivalent circuit of a capacitor array shown in the crystal oscillator.

The present invention relates to a method for compensating temperature in the crystal oscillator. A temperature adaptive capacitor array structure is employed in the present invention. The temperature adaptive capacitor array structure reduces the number of cells to reduce silicon area. And, each cell is consisted of one unit capacitor, switch transistor and a distributed decoding logic. The number of cells reduces not only area taken by predecoding logic and interconnection logic but also area taken by the cells. Some cells use capacitor having value higher than the minimum unit capacitor to reduce the number of cells while maintain various capacitance. Capacitor is only added to increase capacitance but needs not to be replaced, so that monotonicity is guaranteed. Therefore, unit capacitance needs not be too small for the monotonocity. The structure has two capacitor arrays in accordance with temperature codes shown in FIG. 4. An equivalent circuit of the capacitor array in the crystal oscillator is shown in FIG. 7. $C_{1,s}$ and $C_{2,s}$ are capacitors having low values and correspond capacitors of the first bank of the capacitor array, and $C_{1,1}$ and $C_{2,1}$ are capacitors having high values and correspond capacitors of the second bank of the capacitor array. $R_{sw,eq}$ is an equivalent circuit of the switch.

The method for compensating temperature using the capacitor array structure, stores data for compensating temperature in the memory, and performs temperature compensation in a manner that the data for compensating temperature is read from the memory in accordance with temperature data sensed by the temperature sensor. Most of the power consumption relates to communication with memory. Therefore, the present invention reduces the size of the memory, and minimizes the number of access to the memory. Thereby, power consumption of the crystal oscillator is decreased.

Hereinafter, embodiments of the present invention will be explained with reference to the accompanying drawings. Although the present invention has been described in conjunction with the preferred embodiment, the present invention is not limited to the embodiments, and it will be apparent to those skilled in the art that the present invention can be modified in variation within the scope of the invention.

BRIEF DESCRIPTION OF THE ATTACHED DRAWINGS

The above and other objects, features and advantages of the present invention will become more apparent from the following detailed description when taken in conjunction with the accompanying drawings in which.

Similar reference characters refer to similar parts in the several views of the drawings.

DESCRIPTION OF THE PREFERRED EMBODIMENT

Referring to appended drawings, detailed description of the present invention is now described.

Referring to FIG. 2, the curve that must be used for compensating oscillation frequency is determined by inclination of frequency variation and polarity. Compensating speed is defined as an amount of frequency variation in accordance with the variation of capacitance. The compensating speed in a compensating area -means the inclination of the curve that should be followed when performing compensation in that area.

When the sign of the amount of frequency variation is positive, in other words, the more the amount of frequency variation close to +TR, the lower the compensating speed becomes. When the sign of the amount of frequency variation is negative, in other words, the more the amount of frequency variation close to −TR, the higher the compensating speed becomes. The highest compensating speed in parallel arrangement enables it possible to determine unit capacitance that satisfies required frequency accuracy (ppm).

The determined unit capacitance is commonly used for all conditions having different compensating speed. However, for the same accuracy in a position having low compensating speed, such a small value of the capacitance is not needed. Therefore, it becomes an obstacle to have more unit capacitors for the decoding logic and silicon area. To avoid such ineffectiveness, other suitable unit capacitance according to the compensating speed can be used.

Figure 5:
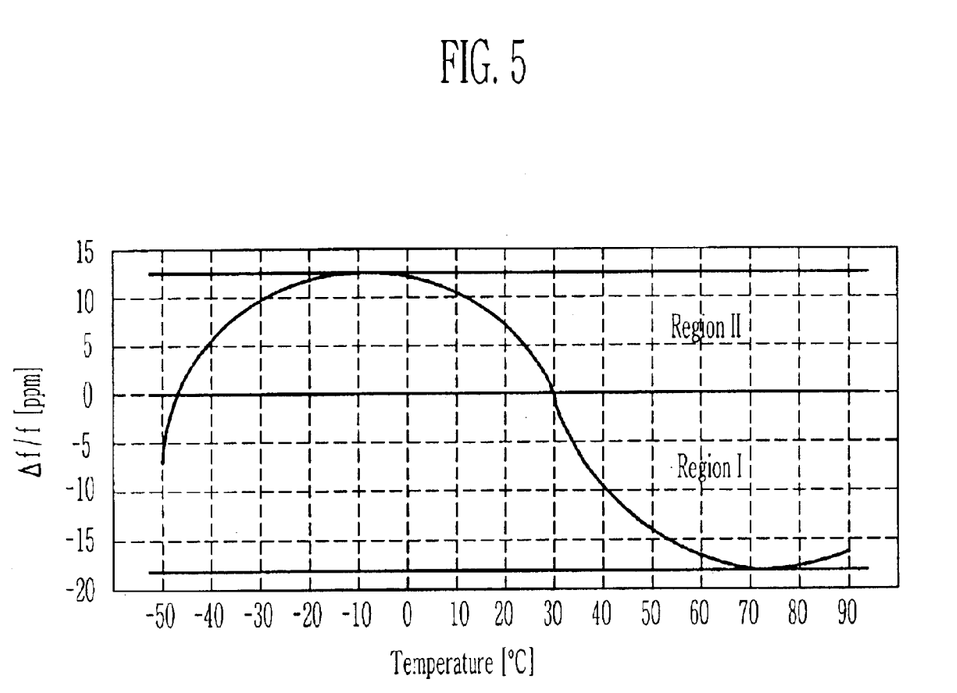
FIGS. 5 shows a graph representing characteristics of frequency and temperature of the crystal oscillator.

FIG. 5 shows a graph representing characteristics of frequency and temperature of the crystal oscillator. Referring to FIG. 5, regions of the frequency variations can be discriminated by using present temperature. To perform this, overall compensating region is divided into first region I and second region II. At this time, the frequency variation has negative sign in the first region, and positive sign in the second region. When the present temperature decreases in the first region, the compensating speed should be high, so that small unit capacitance must be used. The compensating speed should be low in the second region, so that relatively big unit capacitance can be used. Therefore, a capacitor array is consisted of two banks. First bank has an unit capacitor used at the temperature corresponding to the first region, and second bank has an unit capacitor used at the temperature corresponding to the second region. When the temperature gradually increases from −30° C., the total capacitance is increased by switching on unit capacitors in the first bank until the temperature reaches 30° C. From 30° C. and above, the total capacitance is increased by switching on unit capacitors in the second bank while maintaining the capacitance in the first bank. To satisfy accuracy specification of frequency, the first bank consists of the smallest unit capacitors, and the second bank consists of the biggest unit capacitors.

The method for compensating temperature in the crystal oscillator in accordance with the preferred embodiment of the present invention uses novel one. First, present temperature outside should be known. And required capacitance is then calculated by using the present temperature. The unit capacitors in required bank should be switched on to increase the capacitance, or some of the unit capacitors should be switched off to decrease the capacitance. This procedure requires digital signals that indicate the present temperature by means of internal temperature sensor, and communication with memory that stores the required capacitance. And, the capacitance read from the memory should be sent to capacitor array and decoded. These series of procedures use the method below for low power consumption and small silicon area.

Hereinafter, the method for compensating temperature in the crystal oscillator in accordance with the preferred embodiment of the present invention will be explained.

Figure 6A:
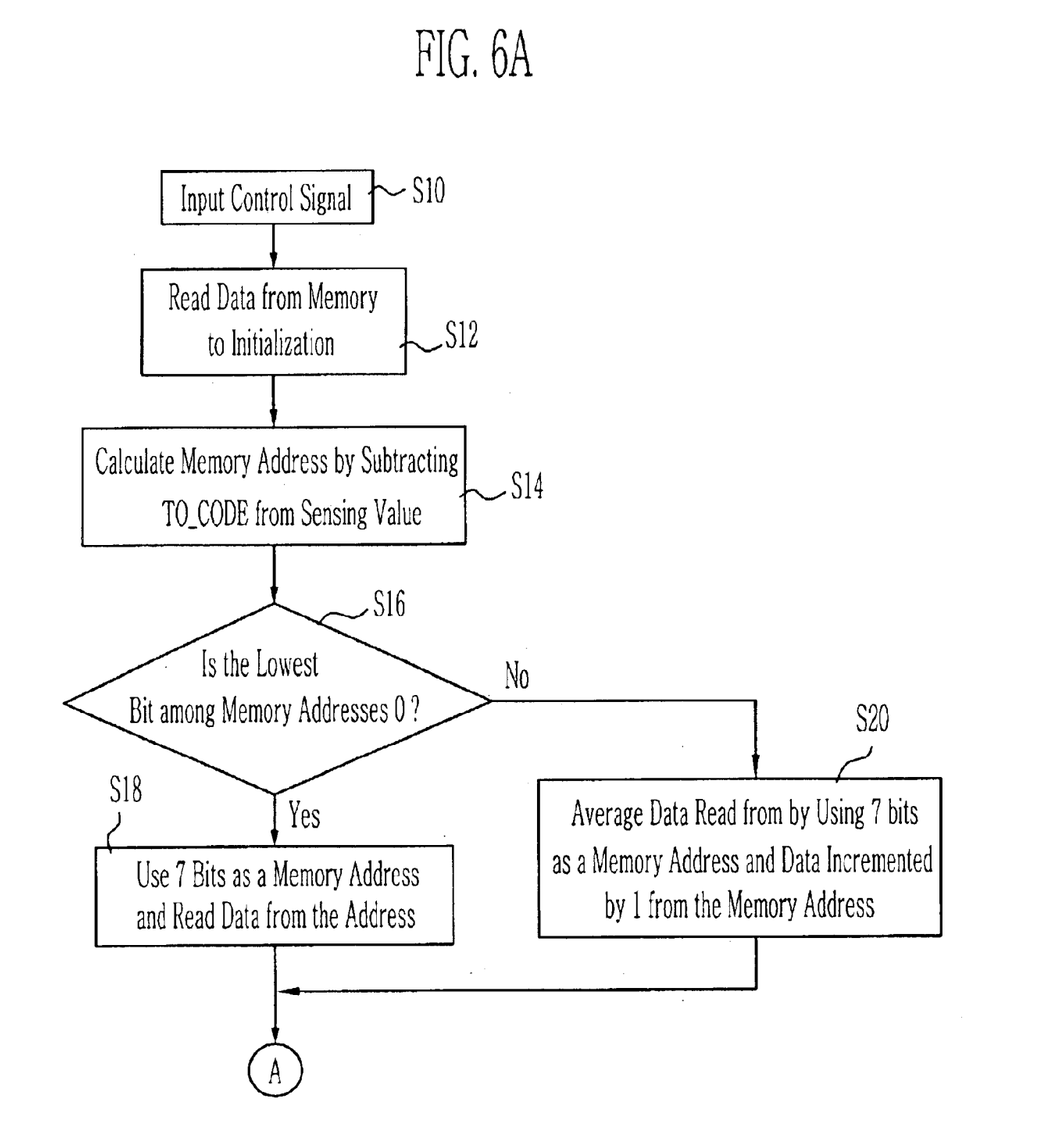
FIGS. 6a and 6b shows a graph for explaining a method for compensating temperature in the crystal oscillator in accordance with the preferred embodiment of the present invention.
Figure 6B:
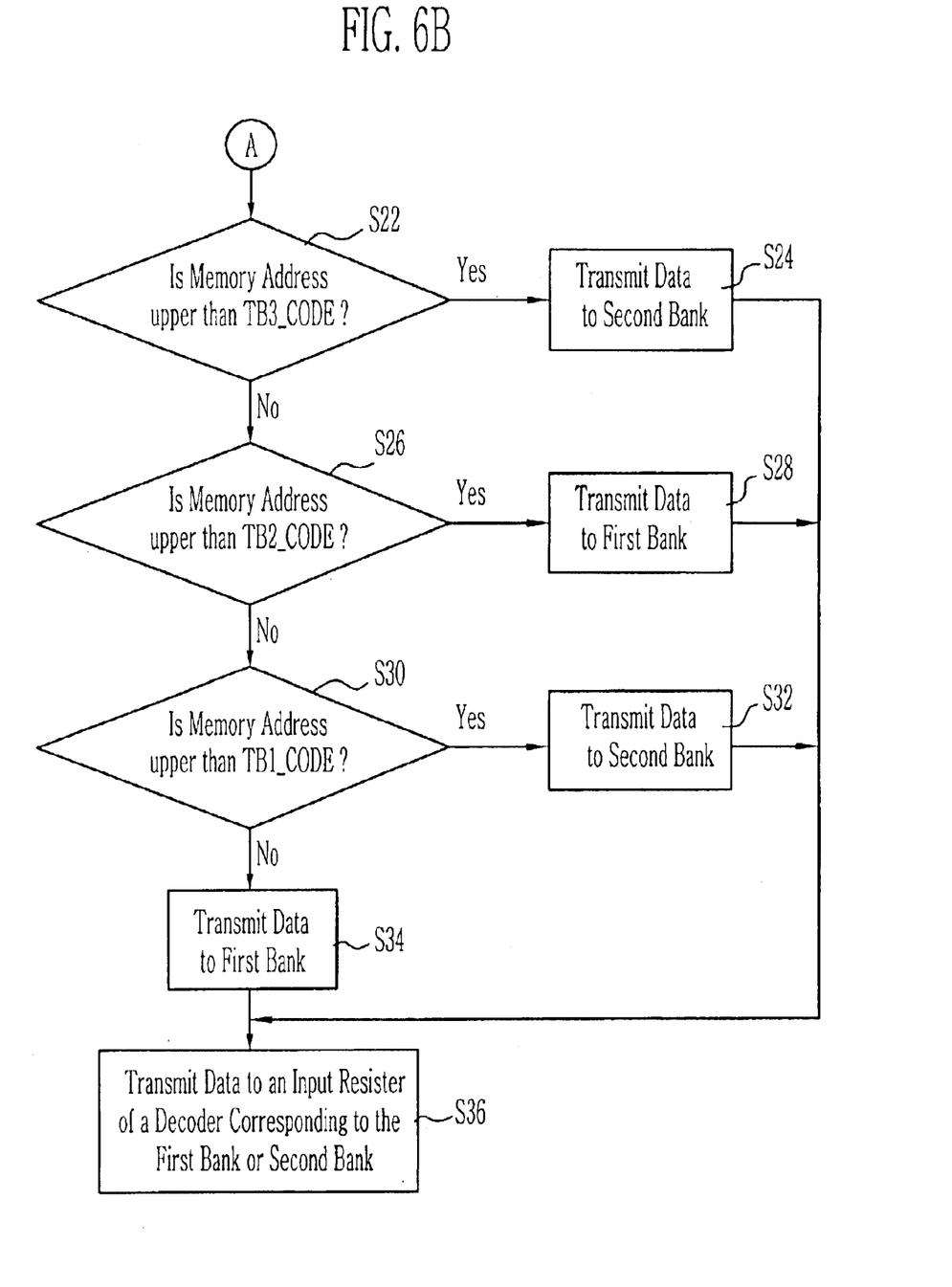

FIGS. 6a and 6b shows a graph for explaining method for compensating temperature in the crystal oscillator in accordance with the preferred embodiment of the present invention.

Referring to FIG. 6a, control procedure starts with control signal CTRL_EN inputted (S10). The control signal CTRL_EN operates as an ACTIVE LOW. At first time, the controller is operable when the control signal CTRL_EN changes from 1 to 0. In addition, the initial operation analyzes operation mode by analyzing bits of serial input. Total 4 modes are supported, however, operation for normal mode will be described for simplicity of description. To activate normal mode even when power is supplied to a chip for the first time, the controller can be initialized as normal mode by the power-on.

When control mode begins, the controller reads required data from the memory (S12). The required data can be any one of NR_CODE, FS_CODE, TO_CODE, TB1_CODE, TB2_CODE, TB3_CODE, MC_CODE, etc. The "NR-CODE" is a capacitor array address for adding negative resistance, the "FS_CODE" is the capacitor array address for capacitance added in accordance with the characteristic of the crystal, the "TO_CODE" is a temperature sensing offset read from the temperature sensor, and the "TB1_CODE" is a memory address that stores a capacitor array address for capacitance at the temperature where the first region begins. The "TB2_CODE" is a memory address that stores a capacitor array address for capacitance at the temperature where the first region ends and the second region begins, the "TB3_CODE" is a memory address that stores a capacitor array address for capacitance at the temperature where the second region ends, and the "MC_CODE" is a maximum capacitor array address for capacitance of the first bank that should be added to the second region. Since these codes are used during procedure of the controller several times, they are stored at registers within the controller and used rather than read from the memory each time.

And, to calculate the compensating capacitance in accordance with the temperature, a memory address that stores a capacitor array address is calculated by subtracting temperature offset code TO_CODE from the sensing value read from the temperature sensor (S14). At this time, if overflow occurs, the memory address has the highest value among memory addresses that store capacitor array addresses, and if underflow occurs, the memory address has the lowest value in the remainder of the memory address space that has stored basic data such as 7 codes described above.

The temperature sensing values are consisted of 9 bits. To save capacitor array addresses corresponding to these temperature sensing values, memory of $2^9$ bits and more is required. In the present embodiment, some of the capacitor array addresses are stored, so that the size of required memory is reduced. The lowest bit among 8 bits excepted LSB 1 bit of the memory address is analyzed (S16).

When the lowest bit is 0 among 8 bits, 7 bits but the 1 bit or LSB among the 8 bits is used as a memory address (S18). And, the controller transmits signals to a memory according to a memory interface, and reads data of the address.

Meanwhile, when the lowest bit is 1 among the 8 bits, interpolation loop is performed (S20). In this case, by using data read from the memory address as 7 bits such as the case when the lowest bit is 0, or using data address with 1 incremented for interpolation, one more data is read from the memory. And, above mentioned two data are averaged. To have the averaged value, those two data are added and divided by 2. Shift operation is used for the division by 2, which shifts added value of those two data 1 bit rightward, and makes 8 bits equal to the data when the lowest bit is 0.

And then, data read from the memory is sent to address of the capacitor array and decoded, so that the capacitor array is adjusted with capacitance corresponding to the present temperature. To perform this, the capacitor array bank must be determined that receives the data read from the memory.

Referring to FIG. 6b, the third temperature boundary code TB3_CODE read from the memory is a memory address that stores the capacitor array address for capacitance at temperature where the second region ends. And the third temperature boundary code TB3_CODE is compared with a memory address calculated at step S14 (S22). If this memory address is upper than the third temperature boundary code TB3_CODE, data is sent to the second bank of the capacitor array (S24). And, the memory address is not compared with the second temperature boundary code TB2_CODE and procedure proceeds to step S36. If this memory address is lower than the third temperature boundary code TB3_CODE, it is compared with the second temperature boundary code TB2_CODE (S26).

If this memory address is upper than the second temperature boundary code TB2_CODE, data read from the memory is sent to the first bank of the capacitor array (S28). And, it is not compared with the first temperature boundary code TB1_CODE, and procedure proceeds to step S36. If this memory address is lower than the second temperature boundary code TB2_CODE, it is compared with the first temperature boundary code TB1_CODE (S30).

If this memory address is upper than the first temperature boundary code TB1_CODE, data read from the memory is sent to the second bank of the capacitor array (S32). And procedure proceeds to step S36. If the memory address is lower than the first temperature boundary code TB1_CODE, the data read from the memory is sent to the first bank of the capacitor array (S34). And, procedure proceeds to step S36.

When each bank is determined, data is sent to an input register of a decoder corresponding to the first bank or the second bank (S36). If the first bank is selected, data is input to a decoder register of the first bank. And, the second bank maintains original data and does not change a control signal. If the second bank is selected, the maximum code value MC_CODE is sent to the first bank, and calculated data is sent to the second bank.

This compensating method is continuously repeated in accordance with clock period applied to the controller. That is, the method compensates temperature in real time.

As described above, the method for compensating temperature in the crystal oscillator in accordance with the present invention reduces silicon area by decreasing the number of cells of capacitor array. So that area taken by the cells as well as area taken by pre-decoding logic and interconnection logic are reduced. In addition, the size of the memory is reduced, and the number of access to the memory is minimized. Therefore, power consumption of the crystal oscillator is decreased.

Although the present invention has been described in conjunction with the preferred embodiment, the present invention is not limited to the embodiments, and it will be apparent to those skilled in the art that the present invention can be modified in variation within the scope of the invention.

What is claimed is:

1. A method for compensating temperature in a crystal oscillator including a capacitor array consisted of a first bank of unit capacitors each with low capacitance and a second bank of unit capacitors each with high capacitance, the method comprising the steps of:

(a) calculating memory address that stores information about the capacitor array address in accordance with the temperature that is subtracted from present temperature by a temperature offset code;

(b) reading data from a memory address corresponding to remain bits excepted lowest bit when the lowest bit is 0 among said memory address;

(c) averaging data read from a memory address corresponding to remain bits excepted lowest bit and data of a memory address incremented by 1 from the memory address when the lowest bit is 1 among said memory address;

(d) transmitting data read from the memory address or averaged data to said first bank or said second bank by comparing the memory address and temperature boundary code; and (e) adjusting said capacitor array with capacitance corresponding to a present temperature by using data transmitted to said first bank or second bank.

2. The method as claimed in claim 1, wherein said memory address of the step (a) has a highest value when overflow occurs, and has a lowest value when underflow occurs.

3. The method as claimed in claim 1, wherein said step (d) comprising the steps of:

comparing said memory address and third temperature boundary code;

transmitting the data read from the memory address or averaged data to said second bank when the memory address has a value higher than said third temperature boundary code;

comparing the memory address and second temperature boundary code when the memory address has a value lower than said third temperature boundary code;

transmitting the data read from the memory address or averaged data to said first bank when the memory address has a value higher than said second temperature boundary code;

comparing the memory address and first temperature boundary code when the memory address has a value lower than said second temperature boundary code;

transmitting the data read from the memory address or averaged data to said second bank when the memory address has a value higher than said first temperature boundary code;

transmitting the data read from the memory address or averaged data to said first bank when the memory address has a value lower than said first temperature boundary code.

4. The method as claimed in claim 3, wherein said first temperature boundary code is a memory address that stores capacitor array address for capacitance at temperature where first region starts, said second temperature boundary code is a memory address that stores capacitor array address for capacitance at temperature where said first region ends and a second region starts, said third temperature boundary code is a memory address that stores capacitor array address for capacitance at temperature where said second region ends, and said first and second regions are frequency variation regions classified in accordance with the present temperature.

5. The method as claimed in claim 1, wherein said step (e) comprising the steps of:

maintaining said second bank of the original data when said data is transmitted to said first bank; and adjusting said capacitor array with a capacitance corresponding to the present temperature by transmitting a highest code value to said first bank when said data is transmitted to said second bank.

* * * * *